(12) United States Patent
Reid, Jr.

(10) Patent No.: US 7,791,183 B1
(45) Date of Patent: Sep. 7, 2010

(54) UNIVERSAL LOW COST MEM PACKAGE

(75) Inventor: James R. Reid, Jr., Billerica, MA (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 51 days.

(21) Appl. No.: 12/152,123

(22) Filed: Jan. 30, 2008

Related U.S. Application Data

(62) Division of application No. 11/108,143, filed on Apr. 11, 2005, now abandoned.

(51) Int. Cl.
*H01L 23/02* (2006.01)

(52) U.S. Cl. .................. 257/678; 257/728; 257/731; 257/E29.324; 257/E21.613; 438/52; 438/53; 438/55

(58) Field of Classification Search ........... 438/51, 438/52, 53, 55; 257/419, 420, 728, 729, 257/731, E29.324, E21.613
See application file for complete search history.

(56) References Cited

U.S. PATENT DOCUMENTS

| | | | | |
|---|---|---|---|---|
| 5,668,033 | A * | 9/1997 | Ohara et al. | 438/113 |
| 6,767,764 | B2 * | 7/2004 | Saia et al. | 438/118 |
| 7,045,868 | B2 * | 5/2006 | Ding et al. | 257/414 |
| 2003/0001251 | A1 * | 1/2003 | Cheever et al. | 257/685 |

* cited by examiner

*Primary Examiner*—Julio J Maldonado
(74) *Attorney, Agent, or Firm*—AFMCLO/JAZ; Jeffrey R. Moore

(57) ABSTRACT

A universal micro-electro mechanical (MEM) device package is provided as having a relatively thin silicon-on-insulator (SOI) wafer having a top surface and a bottom surface. At least on MEM device maybe disposed on the top surface of the SOI wafer. A support member may be disposed on predetermined portions of the top surface of the SOI wafer to substantially surround the MEM device. A cap layer may be positioned over and in contact relationship with the support member. In this arrangement, the support member cooperates with the cap layer and predetermined portions of the top surface of the SOI wafer to form a hermetically sealed chamber surrounding the MEM device.

6 Claims, 4 Drawing Sheets

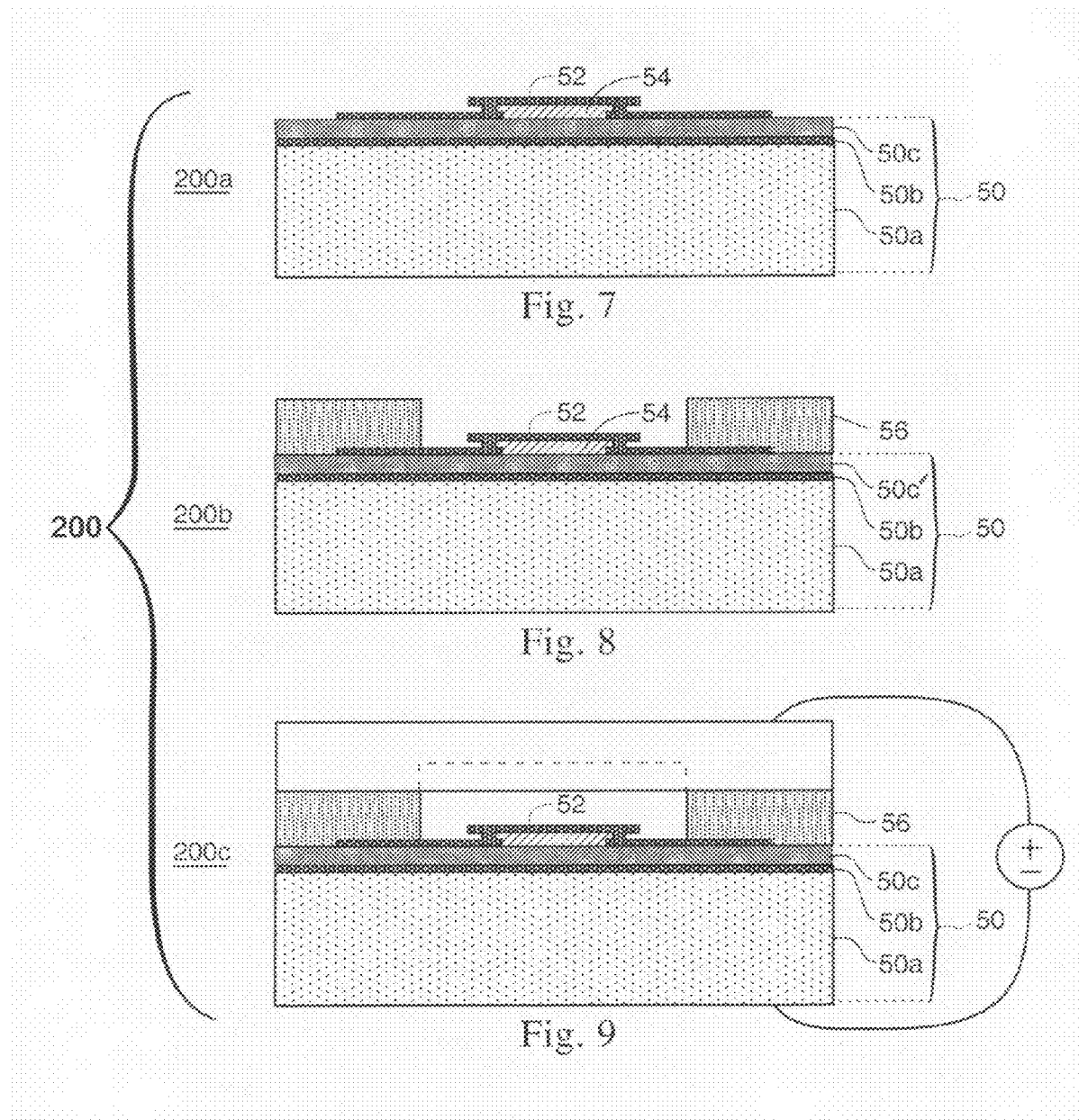

UNIVERSAL LOW COST MEM PACKAGE

CROSS-REFERENCE TO RELATED APPLICATION

This is a divisional of patent application Ser. No. 11/108,143 filed Apr. 11, 2005 now abandoned, herein incorporated by reference.

RIGHTS OF THE GOVERNMENT

The invention described herein may be manufactured and used by or for the Government of the United States for all governmental purposes without the payment of any royalty.

BACKGROUND OF THE INVENTION

The invention relates generally to device packaging and, more particularly to a universal low cost micro electro-mechanical (MEM) device package.

As is known, a wide variety of MEM device packaging approaches and techniques are commonly employed to package a variety of MEM devices, such as micro motors actuators and the like. These packaging approaches can be loosely grouped as either hybrid post processing or wafer scale capping. Hybrid post processing is generally more expensive and requires significant tooling. Wafer scale packaging, on the other hand, has the potential to be low cost, but is typically hindered by the need to provide at least one feed through from the sealed device to the external world. The feed through can be formed by etching from the backside of the wafer. However, etching through a thick wafer results in a long via that typically is quite large. On the other hand, a surface feed through is often difficult to form because the contact area must be exposed to permit the surface feed through to be formed.

One example of a wafer scale packaging technique that uses a surface feed through may be realized by inspection of a commercially available microwave MEM switch. In the MEM switch, a cap wafer with cavities etched into it is bonded to a device wafer. The cap wafer is removed from the regions where contacts are needed. Finally, the wafers are diced using a dicing saw. However, this process has several drawbacks, the process to remove undesired cap material adds significant time and expense to the process. Second, the process results in a very large area for the external pads. It would, therefore, be desirable to overcome the aforesaid and other disadvantages.

SUMMARY OF THE INVENTION

A universal micro-electro mechanical (MEM) device package is set forth. The MEM device package includes a relatively thin silicon-on-insulator (SOI) wafer having a top surface and a bottom surface. At least one MEM device may be disposed on the top surface of the SOI wafer. A support member may be disposed on predetermined portions of the top surface of the SOI wafer to substantially surround the MEM device. A cap layer may be positioned over and in a contact relationship with the support member. The support member cooperates with the cap layer and predetermined portions of the top surface of the SOI wafer to form a sealed chamber surrounding the MEM device.

In another aspect of the present invention, a method of forming a universal MEM device package is set forth. The method of forming the universal MEM device package includes disposing at least one MEM forming structure on a top surface of a silicon-on insulator (SOI) wafer, which may be supported by a relatively thick wafer substrate. At least one MEM device may be disposed on the MEM forming structure. The MEM forming structure may thereafter be released to provide the MEM device as self-supporting on the top surface of the SOI wafer. A support member maybe disposed on predetermined portions of the top surface of the SOI wafer to substantially surround the MEM Device. Thereafter, a cap layer may be positioned over and in a contact relationship with the support member. In this arrangement, the support member cooperates with the cap layer and predetermined portions of the top surface of the SOI wafer to form a sealed chamber surrounding the MEM device.

BRIEF DESCRIPTION OF THE DRAWINGS

The invention will be more fully understood from the following detailed description taken in conjunction with the accompanying drawings, in which:

FIGS. 7-9 show another embodiment of the universal MEM device package and method;

DETAILED DESCRIPTION

The present invention provides a universal low cost MEM device package and method of manufacturing the same. The MEM device package is constructed and arranged to provide a relatively thin profile having relatively short electrical connections between devices contained within the package and external contact pads, which is particularly useful in minimizing signal loss and maximizing performance of relatively high frequency devices (e.g. X-band or higher). The MEM device package may be employed to provide hermetically sealed packaging for a number of relatively high frequency MEM devices and components, as well as for a number of relatively high frequency semiconductor devices.

Figure 1:
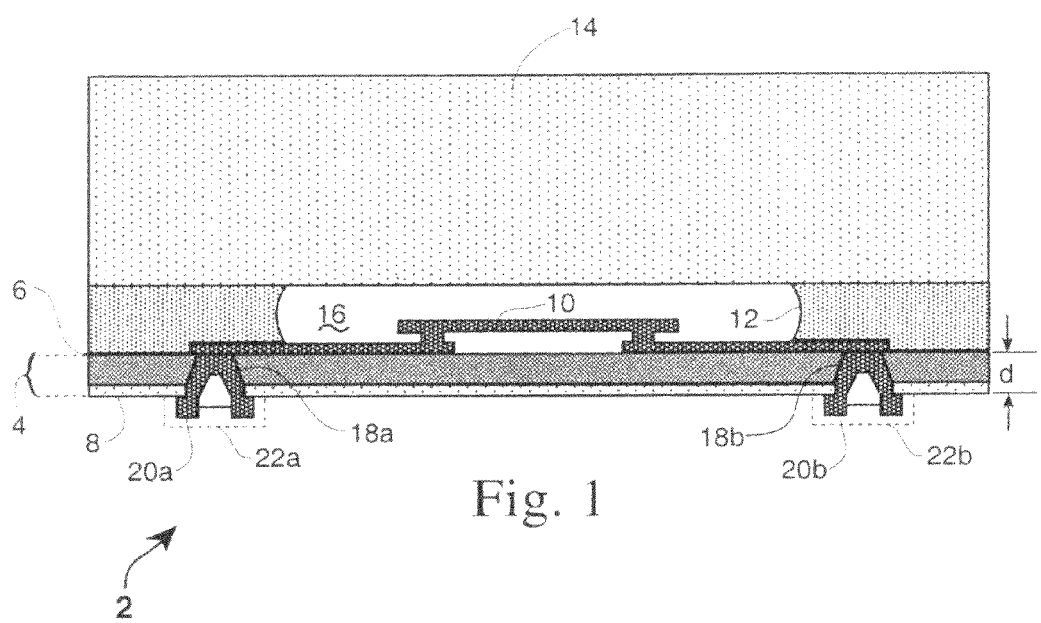
FIG. 1 shows an embodiment of the universal MEM device package in accordance with the present invention.

Referring now to FIG. 1, shown is one embodiment of the universal MEM device package 2 in accordance with principles of the present invention. In the illustrative embodiment, the MEM device package 2 includes a silicon-on-insulator (SOI) wafer 4 having a top surface 6 formed of silicon and a bottom surface 8 formed of an insulating or dielectric material, such as oxide or silicon dioxide. At least one MEM device 10 is disposed on the top surface 6 of the SOI wafer 4 using fabrication techniques which are readily apparent to those of ordinary skill in the art of thin film or integrated circuit fabrication. A support member 12 may be disposed on predetermined portions of the top surface 6 of the SOI wafer 4 to generally surround the MEM device 10. The support member 12 may include a number of sealing and/or adhesive materials. For example, the support members may include individual materials or material compositions of a glass frit, nitride, polymer, silicon-oxide or aluminum oxide.

A cap layer 14 may be positioned over and in a contact relationship with the support member 12. In this arrangement, the support member 12 cooperates with the cap layer 14 and predetermined portions of the top surface 6 of the SOI wafer 4 to form a sealed chamber 16 surrounding the MEM device 10. In the exemplary embodiment, the cap layer 14 may include silicon, however, it should be understood that the cap layer 14 may also include a number of other thermally matched materials, such as Pyrex glass, glass or plastic. The MEM device package 2 may further include a number of relatively shallow or thin vias 18a, 18b, as represented by the depth "d", which are formed on a bottom surface 8 of the SOI wafer 4. The vias 18a, 18b may extend upwardly the depth "d" to expose predetermined portions of the MEM device 10 previously disposed on the top surface 6 of the SOI wafer 4. In an embodiment, the depth "d" may range from approximately five (5) microns to approximately twenty-five (25) microns depending on the size of the cavity 16 that is required for the MEM device 10 intended to be retained on the MEM device package 2. Accordingly a relatively short conductive plug 20a, 20b may respectively be disposed in each of the vias 18a, 18b for which each conductive plug 20a, 20b may include a first end 20a, 20b coupled to exposed portions of the MEM device 10 and a second end 20a, 20b coupled to contact pads 22a, 22b, respectively. The contact pad is operative to serve as an interface to the MEM device package. The conductive plugs 20a, 20b may each include a number of conductive material and/or alloys, such as copper, gold, aluminum or tungsten.

Figure 2:
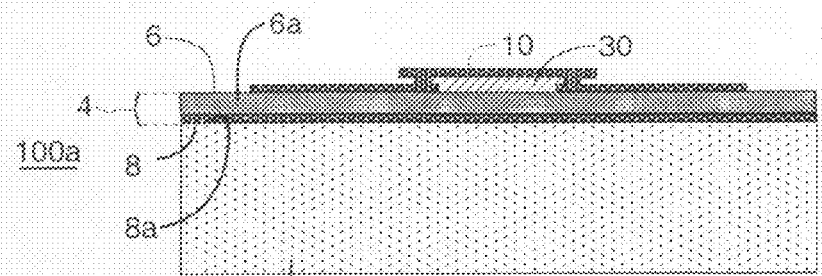
FIGS. 2-5 show one embodiment of a method of forming the universal MEM device package of FIG. 1.

FIGS. 2-5 show a method 100 of forming the universal MEM device package 2, as shown and described above with respect to FIG. 1. In FIG. 2, at step 100a, at least one MEM forming structure 30 is disposed on the top surface 6 of the SOI wafer 4 which in the exemplary embodiment is supported by a relatively thick wafer substrate 32. Although the SOI wafer 4 is shown and described herein as including a relatively thin silicon layer 6a (i.e., top layer) disposed on a relatively thin oxide layer 8a (i.e. bottom layer), it should be readily understood that in other embodiments, the SOI wafer 4 may be redefined to further include the relatively thick wafer substrate 32. In other words, the SOI wafer 4 may be redefined to include a three layer structure including the relatively thick wafer substrate 32 and relatively twin silicon layer 61 sandwiching the relatively thin oxide layer 8a. Thus, in one exemplary embodiment, the SOI wafer 4 may be dimensioned to include the wafer substrate 32 as having a thickness ranging from approximately 300 microns to approximately 600 microns; the relatively thin intermediate layer of oxide as having a thickness ranging from approximately 0.5 microns to approximately 4.0 microns and the relatively thin top layer of silicon as having a thickness ranging from approximately 0.5 microns to approximately 30 microns.

Figure 3:
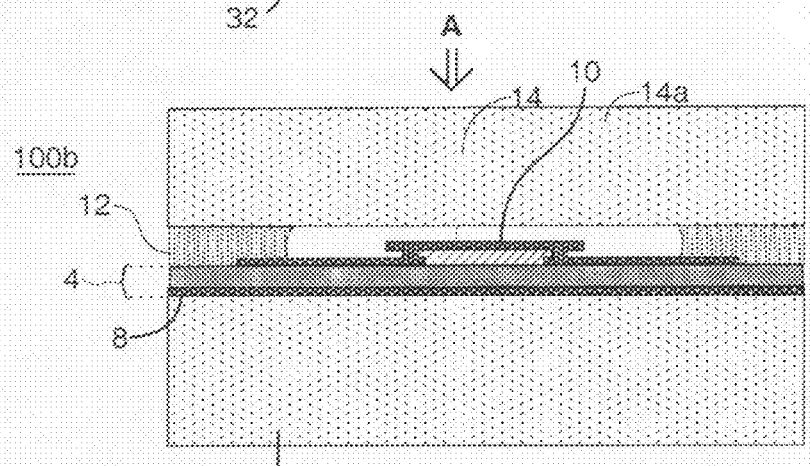

At step 100a, the method 100 further includes disposing at least one MEM device 10 on the MEM forming structure 30 followed by releasing the MEM forming structure 30 to provide the MEM device self-supporting on the top surface 6 of the SOI wafer 4, which is shown in FIG. 3. In FIG. 3, which represents step 100b of the method 100 the SOI wafer 4 is capped with the second wafer or cap layer 14. Capping is accomplished by disposing the adhesive support member 12 around the periphery of the released MEM device 10, which in the exemplary embodiment includes screen printing a glass frit around the periphery of the released MEM device 10. The cap layer 14 is then substantially aligned with the contacted to the frit, which serves as an adhesive and the support member 12. After contacting the cap layer 14 to the glass frit, a downwardly directed force, as referenced by the downwardly directed arrow labeled "A," is applied to the top surface 14a of the cap layer 14 for compressing the cap layer 14 to the SOI wafer 4, via the glass frit serving as the support member 12.

The entire stack, as shown in FIG. 3, may be heated to cure the glass frit for forming a hermetic seal around the MEM device 10. Typically, the glass frit may be cured at a temperature ranging from approximately 300 degrees Celsius to approximately 450 degrees Celsius. Although the cap layer 14 is shown and described herein as including silicon, it should be understood that the cap layer 14 may include a number of materials that have a reasonably close thermal match to the relatively thick substrate 32 (i.e., bottom layer), such as glass or Pyrex glass.

Figure 4:
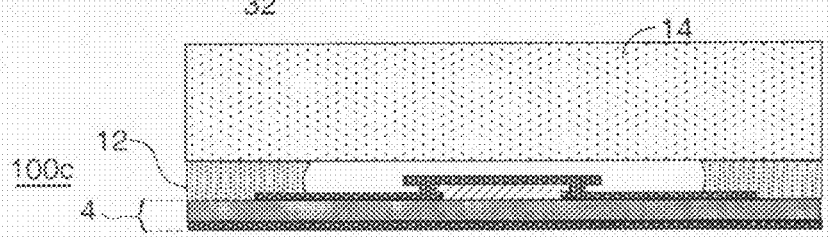

At step 100c shown in FIG. 4, the relatively thick wafer substrate 32 can now be removed. Removal of the relatively thick wafer substrate 32 may be accomplished by a variety of techniques, but care must be taken to protect the cap layer 14 from damage. One relatively low cost method for removing the thick wafer substrate 32 includes depositing silicon nitride on the cap layer 14 top and sides (assuming the die represented in FIG. 4 is only one die of an array of die elements defined on a wafer) and isotropically etching the thick silicon 32 in an hydrofluoric acid-nitric acid-acetic acid (HNA) solution until its thickness is approximately 50 microns. This remaining layer of silicon is then removed using an etching solution of tetra-methyl ammonium hydroxide (TMAH) which steps on the buried oxide layer (or silicon dioxide layer if employed as an intermediate layer instead of oxide).

Figure 5:
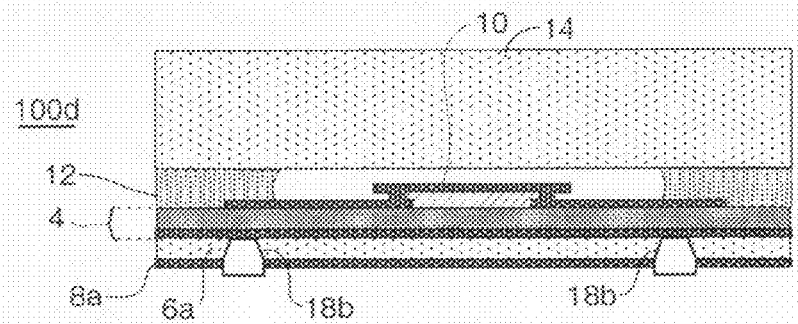

In FIG. 5 and at step 100d, a number relatively thin vias 18a, 18b may be formed on the bottom surface 8 of the SOI wafer 4, which formation of such vias 18a, 18b is controlled to extend through the SOI wafer 4 to expose predetermined portions of the MEM device 10.

Further, a number of relatively short plugs 20a, 20b (FIG. 1) may be respectively formed in each of the number of relatively thin vias 18a, 18b located on the bottom surface 6 of the SOI wafer 4 for coupling to the exposed predetermined portions of the MEM device 10. It should be understood that using back side vias 18a, 18b eliminates the need for exposing front side contact pads. This results in a MEM device package 2 that is significantly more compact as opposed to other device packages that rely on techniques that expose pads by etching away or milling the cap wafer to expose front side pads. Furthermore, the use of relatively shallow vias 18a, 18b also appreciably reduces etching times. In an embodiment, the vias 18a, 18b may be formed on the bottom layer 8 of the SOI wafer 4 using standard photolithography techniques that are well known, which commences with patterning the vias 18a, 18b on the bottom layer 8 of the SOI water 4 using a mask (not shown). The vias 18a, 18b can be aligned using an aligner (not shown) with infrared capability to see the metal associated with the MEM device 10, which may be layers buried in the SOI wafer 4. The vias 18a, 18b are etched through both the oxide 8a and the thin silicon layer 6a of the SOI wafer 4, using the metal or portions of the MEM device 10 located on the surface of the SOI wafer 6 as an etch stop. The exposed vias 18a, 18b can be metallized or bump bonds can be added for integrating the MEM device package 2 (FIG. 1) with other components.

Although the universal MEM device package 2 (FIG. 1) of the present invention has been described above with reference to a single die, it should be readily understood that the structure and method may be scaleable to a full wafer level process. More particularly and although not specifically shown, the above described method 100 may be scaled to form a plurality of universal MEM device packages, which are similar to the MEM device package 2, on a relatively large diameter SOI wafer (e.g., 12 inch diameter SOI wafer). The large diameter SOI wafer having the plurality of universal MEM device packages disposed thereon may be subsequently sliced to form a plurality of individual die universal MEM device packages.

Figure 6:
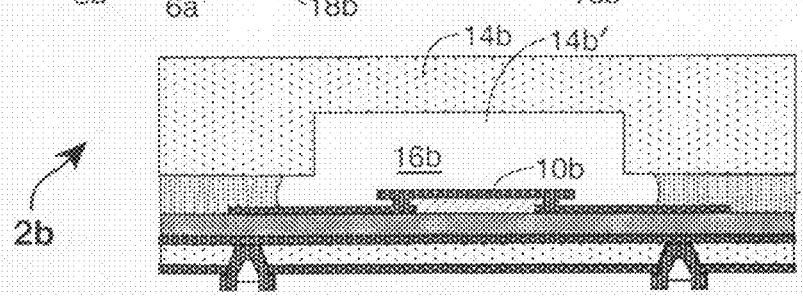
FIG. 6 shows another embodiment of the MEM device package of FIG. 1 and including a notched cap layer.

Referring to FIG. 6, shown is another embodiment of the universal MEM device package 2b. The universal MEM device package 2b of the exemplary embodiment provides a cap layer 14b, which includes a notched region 14b. The notched region 14b of the cap layer 14b is formed on a portion of the cap layer 14b that faces the MEM device 10 and operates to increase the spatial volume within the hermetically sealed chamber 16b of the MEM device package 2b. The notched region may be formed on the cap layer 14b using known grinding and/or etching techniques prior to disposing the cap layer 14b onto the support member 12b and/or glass frit. The increase in the interior spatial volume of the sealed chamber 16b of the MEM device package 2b, may be particularly desirable for MEM devices 10b that have characteristics requiring additional space, such a MEM devices 10b having deflection, actuation and/or other motion related characteristics. FIGS. 7-9 show another embodiment of a method 200 for forming a universal MEM device package that is similar to the MEM device package 2, shown above with respect to FIG. 1. However, the method 200 of this exemplary embodiment operates to minimize out gassing during processing, so as to minimize any potential damage to particle sensitive MEM devices.

In FIG. 7 and at step 200a, an SOI wafer 50 is provided as having three layers including, a relatively thick silicon bottom layer 50a, a relatively thin oxide or dioxide layer 50b disposed on the bottom layer 50a and a relatively thin silicon top layer 50c. Further a MEM device 52 (i.e., particle sensitive device) is disposed on the top surface 50c of the relatively thin silicon top layer 50c and is supported by a MEM forming structure 54 (i.e., the MEM is not yet released at this point in the process).

FIG. 8 and step 200b show a patterned spacer member 56 which is disposed on the top surface 50c of the relatively thin silicon top layer 50c and planarized. The spacer member 56 should have a greater height than the MEMS device 52 to provide enough clearance for the cap layer 58 (FIG. 10) to be supported over the MEM device 52 without contacting or impeding actuation of the MEM device 52. In an embodiment, the spacer material 56 may include at least one or combination of a glass frit, nitride, photoresist, silicon oxide and aluminum oxide.

FIG. 9 and step 200c show the MEM device 52 in a released state in which the MEM forming structured 54 is now removed using any of a number of material removal techniques. For example, the MEM forming structure 54 may be removed by selectively etching polymethylglutarimide (PMGI) using a commercially available PMGI stripper such as MicroChem's Remover PG. Further, a cap layer 15 that is similar to the cap layer 14 of FIG. 1 or the cap layer 14b or FIG. 6 may be disposed on the support member 56 and rather than using a glass frit, as described above with respect to FIG. 3, in FIG. 9, a fusion bonding process is applied to couple the cap layer 15 to the support member 56 to form a seal for the MEM device 52.

Using fusion bonding to couple the cap layer 15 to the support member 56 eliminates the need to cure a glass frit, and thus, minimizes or eliminates any out gassing that may otherwise occur during the cure process. Thereafter, the bottom layer 50a may be processed in a manner similar to that described above with respect to FIGS. 4 and 5.

Figure 10:
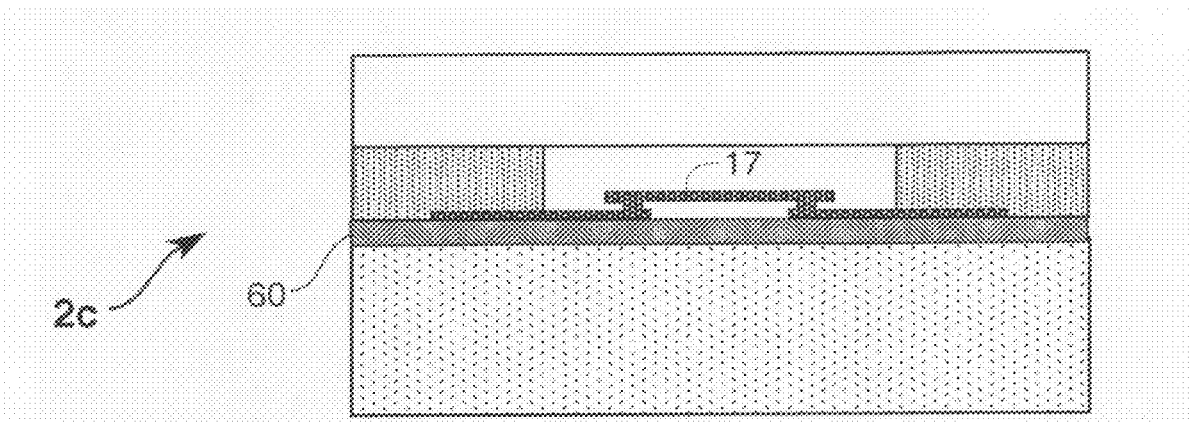
FIG. 10 shows another embodiment of the universal MEM device package.

FIG. 10 shows another embodiment of a MEM device package 2c in which a glass substrate 60 is substituted for the layers 50a, and 50b of the SOI wafer 50 shown in FIG. 9. In this arrangement, the glass substrate further reduces losses for potentially higher operational frequency MEM devices, such as MEM device 17 which may be adapted to operate at a frequency of 60 GHz or more.

Figure 11:
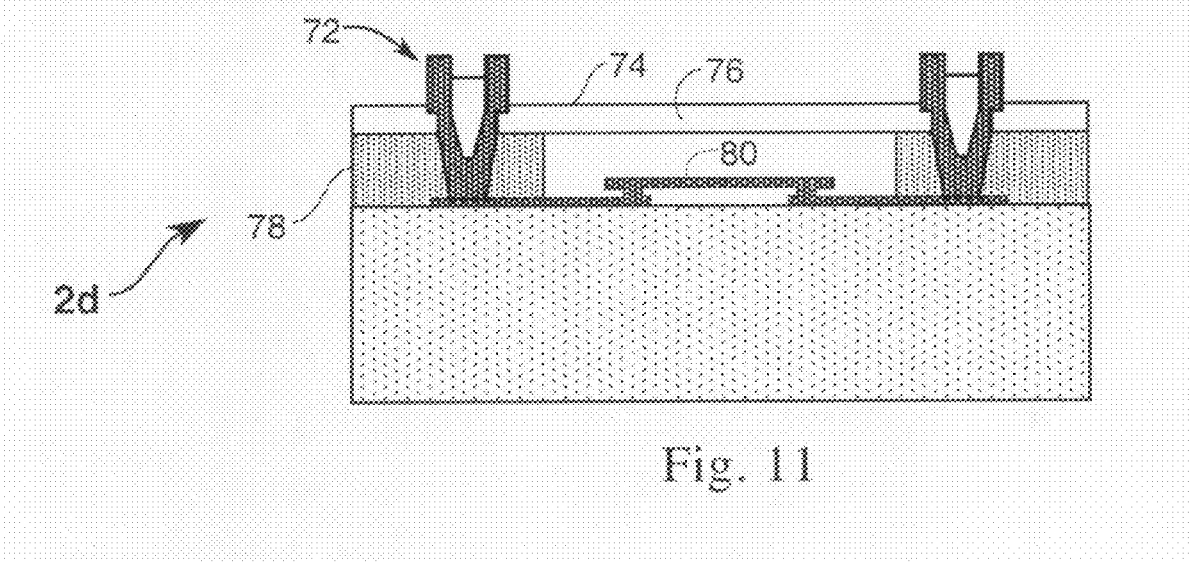
FIG. 11 shows yet another embodiment of the universal MEM device package.

FIG. 11 shows another embodiment of the universal MEM device package 2d in which at least one plug filled via 72 is formed on a top surface 74 of the cap layer 76 and extends downwardly through the support member 78 to couple to at least one predetermined portion of the MEM device 80. The plug filled via 72 can be formed using etching and metallization techniques commonly know in wafer fabrication processes.

The above described embodiments of the universal MEM device packages 2, 2b, 2c, 2d and methods 100, 200 may be suitable for a wide range of MEM devices, such as accelerometers, gyroscopes, microwave and millimeter wave components, and micro-optical systems.

Furthermore, the universal MEM device packages 2, 2b, 2c, 2d and methods 100, 200 may be of particular value because they provide a method for packaging MEM devices that is relatively low cost, relies on widely available process techniques, can be done after device fabrication, and does not require an increase in die size. The universal MEM device packages 2, 2b, 2c, 2d and methods 100, 200 also provide a compact package structure with very low loss plug filled vias, which are particularly useful for interfacing to relatively high operational frequency MEM devices (e.g., 30 GHz range or even higher) which are contained therein. Although not specifically shown, it should be readily understood that the resulting MEM device packages 2, 2b, 2c, 2d can be mounted using low cost pick and place machines. It is possible to use the die with either traditional wire bonding or flip chip bonding. After the MEM device packaging is complete, the die can be treated as if it were a more standard MMIC, and further packaging can be done at a much lower cost.

One skilled in the art will appreciate further features and advantages of the invention based on the above-described embodiments. Accordingly, the invention is not to be limited by what has been particularly shown and described, except as indicated by the appended claims. All publications and references cited herein are expressly incorporated herein by reference in their entirety.

What is claimed is:

1. A universal micro-electro mechanical (MEM) device package, comprising:
   a silicon-on-insulator (SOI) wafer having a top surface and a bottom surface and a thickness of about 5 microns to about 25 microns;
   at least one MEM device disposed on the top surface of the SOT wafer, the MEM device having two spaced horizontal base members, a pair of leg members resting upon and supported by the base members, and a raised horizontal table member resting upon and supported by the leg members;
   a support member disposed on predetermined portions of the top surface of the SOI wafer to substantially surround the MEM device;
   a cap layer positioned over and in a contact relationship with the support member, wherein the support member cooperates with the cap layer and predetermined portions of the top surface of the SOI wafer to form a sealed chamber surrounding the MEM device;
   a number of plug filled vias selectively formed on a top surface of the cap layer and extending downwardly through the support member to couple to at least one predetermined portion of the MEM device;

a number of relatively thin vias selectively formed on the bottom surface of the SOI wafer, extending upwardly to expose predetermined portions of the MEM device; and a number of relatively short plugs, each of the number of short plugs being disposed in each of the number of thin vias located on the SOI wafer for coupling to the exposed predetermined portions of the MEM device.

2. The universal MEM device package of claim 1, wherein the cap layer includes at least one of silicon, quartz, glass or polymer materials.

3. The universal MEM device package of claim 1, wherein the support member includes a material including at least one of a glass frit, nitride, silicon-oxide and aluminum oxide.

4. A universal micro-electro mechanical (MEM) device package, comprising:

a glass wafer having a top surface and a bottom surface and a thickness of about 5 microns to about 25 microns;

at least one MEM device disposed on the top surface of the glass wafer, the MEM device having two spaced horizontal base members, a pair of leg members resting upon and supported by the base members, and a raised horizontal table member resting upon and supported by the leg members;

a support member disposed on predetermined portions of the top surface of the glass wafer to substantially surround the MEM device;

a cap layer positioned over and in a contact relationship with the support member, wherein the support member cooperates with the cap layer and predetermined portions of the top surface of the SOI wafer to form a sealed chamber surrounding the MEM device;

a number of plug filled vias selectively formed on a top surface of the cap layer and extending downwardly through the support member to couple to at least one predetermined portion of the MEM device package, the MEM device package further including a number of relatively thin vias selectively formed on the bottom surface of the glass wafer and extending upwardly to expose predetermined portions of the MEM device and;

a number of relatively short plugs, each of the number of short plugs being disposed in each of the number of thin vias located on the glass wafer for coupling to the exposed predetermined portions of the MEM device.

5. The universal MEM device package of claim 4, wherein the cap layer includes at least one of silicon, quartz, glass or polymer materials.

6. The universal MEM device package of claim 4, wherein the support member includes a material including at least one of a glass frit, nitride, silicon-oxide and aluminum oxide.

* * * * *